US011662667B2

(12) United States Patent
Liu

(10) Patent No.: US 11,662,667 B2
(45) Date of Patent: May 30, 2023

(54) EXPOSURE MACHINE

(71) Applicant: CHANGXIN MEMORY TECHNOLOGIES, INC., Hefei (CN)

(72) Inventor: Bo Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 94 days.

(21) Appl. No.: 17/439,566

(22) PCT Filed: Jun. 17, 2021

(86) PCT No.: PCT/CN2021/100589
§ 371 (c)(1),
(2) Date: Sep. 15, 2021

(87) PCT Pub. No.: WO2022/134500
PCT Pub. Date: Jun. 30, 2022

(65) Prior Publication Data
US 2023/0064171 A1 Mar. 2, 2023

(30) Foreign Application Priority Data
Dec. 23, 2020 (CN) .......................... 202011546676.2

(51) Int. Cl.
G03F 7/20 (2006.01)

(52) U.S. Cl.
CPC ........ G03F 7/70725 (2013.01); G03F 7/7085 (2013.01); G03F 7/70733 (2013.01); G03F 7/70758 (2013.01); G03F 7/70808 (2013.01)

(58) Field of Classification Search
CPC ............. G03F 7/70725; G03F 7/70733; G03F 7/70758; G03F 7/7085
See application file for complete search history.

(56) References Cited

U.S. PATENT DOCUMENTS 4,694,527 A      9/1987  Yoshizawa
6,746,543 B2 *   6/2004  Kamikawa ........ H01L 21/67051
                                                          134/28

(Continued)

FOREIGN PATENT DOCUMENTS

CN      105652588 A      6/2016
CN      106672660 A      5/2017

(Continued)

OTHER PUBLICATIONS

International Search Report as cited in PCT/CN2021/100589 dated Sep. 28, 2021, 10 pages.

Primary Examiner — Hung V Nguyen
(74) Attorney, Agent, or Firm — Cooper Legal Group, LLC

(57) ABSTRACT

The present application provides an exposure machine, relates to semiconductor integrated circuit manufacturing technologies. The exposure machine includes a machine platform, a shielding device, and a drive device; the machine platform is provided with a recess portion, the recess portion has a top opening, a base and a placement table are disposed in the recess portion, the placement table is configured to carry a mask carrier, and the mask carrier can be placed on the placement table through the top opening; and the machine platform is further provided with a drive device and a movable shielding device, when the shielding device is at an initial position, the shielding device covers the top opening, and when the mask carrier needs to be placed on the placement table through the top opening, the drive device opens the shielding device to expose the top opening.

15 Claims, 10 Drawing Sheets

(56) References Cited

U.S. PATENT DOCUMENTS

2017/0017168 A1\* 1/2017 Liao .................... G03F 7/70725
2022/0102177 A1\* 3/2022 Chiu .................... G03F 7/7075

FOREIGN PATENT DOCUMENTS

| CN | 106094443 B | 12/2017 |
|---|---|---|
| CN | 108121173 A | 6/2018 |
| CN | 208673040 U | 3/2019 |

\* cited by examiner

EXPOSURE MACHINE

CROSS-REFERENCE TO RELATED APPLICATIONS

The present application is a national stage entry of International Application No. PCT/CN2021/100589, filed on Jun. 17, 2021, which claims the priority to Chinese Patent Application No. 202011546676.2, titled "EXPOSURE MACHINE", filed to China National Intellectual Property Administration (CNIPA) on Dec. 23, 2020. The entire contents of International Application No. PCT/CN2021/100589 and Chinese Patent Application No. 202011546676.2 are incorporated herein by reference.

TECHNICAL FIELD

The present application relates to semiconductor integrated circuit manufacturing technologies, and in particular, to an exposure machine.

BACKGROUND

An exposure machine is machinery equipment that transfers, by ultraviolet light of a UVA wavelength, image information on a film or other transparent body to a surface coated with a light-sensitive substance.

In the related art, the exposure machine is provided with a recess portion, a top of the recess portion has a top opening, a front side of the recess portion has a front side opening, a movable placement table is disposed inside the recess portion, and a mask outside the exposure machine may be placed on the placement table through the top opening or the front side opening, and then enter the inside of the exposure machine.

However, particles in the environment may enter through the top opening and fall on the placement table, and then enter the exposure machine with the mask on the placement table, contaminating the mask and reducing a product yield rate after wafer exposure.

SUMMARY

Embodiments of the present application provide an exposure machine, including a machine platform, a shielding device, and a drive device; the machine platform is provided with a recess portion, the recess portion has a top opening, a base and a placement table are disposed in the recess portion, the placement table is disposed on the base and can ascend and descend, the placement table is configured to carry a mask carrier, the mask carrier is loaded with a mask, and the mask carrier can be placed on the placement table through the top opening; and the machine platform is further provided with the drive device and the movable shielding device, the drive device is connected with the shielding device, when the shielding device is at an initial position, the shielding device covers the top opening, and when the mask carrier needs to be placed on the placement table through the top opening, the drive device opens the shielding device to expose the top opening, so that the mask carrier can be placed on the placement table through the top opening.

BRIEF DESCRIPTION OF THE DRAWINGS

To describe the technical solutions in the embodiments of the present application more clearly, the accompanying drawings required to describe the embodiments are briefly described below. Apparently, the accompanying drawings described below are only some embodiments of the present application. A person of ordinary skill in the art may further obtain other accompanying drawings based on these accompanying drawings without creative efforts.

Figure 1:
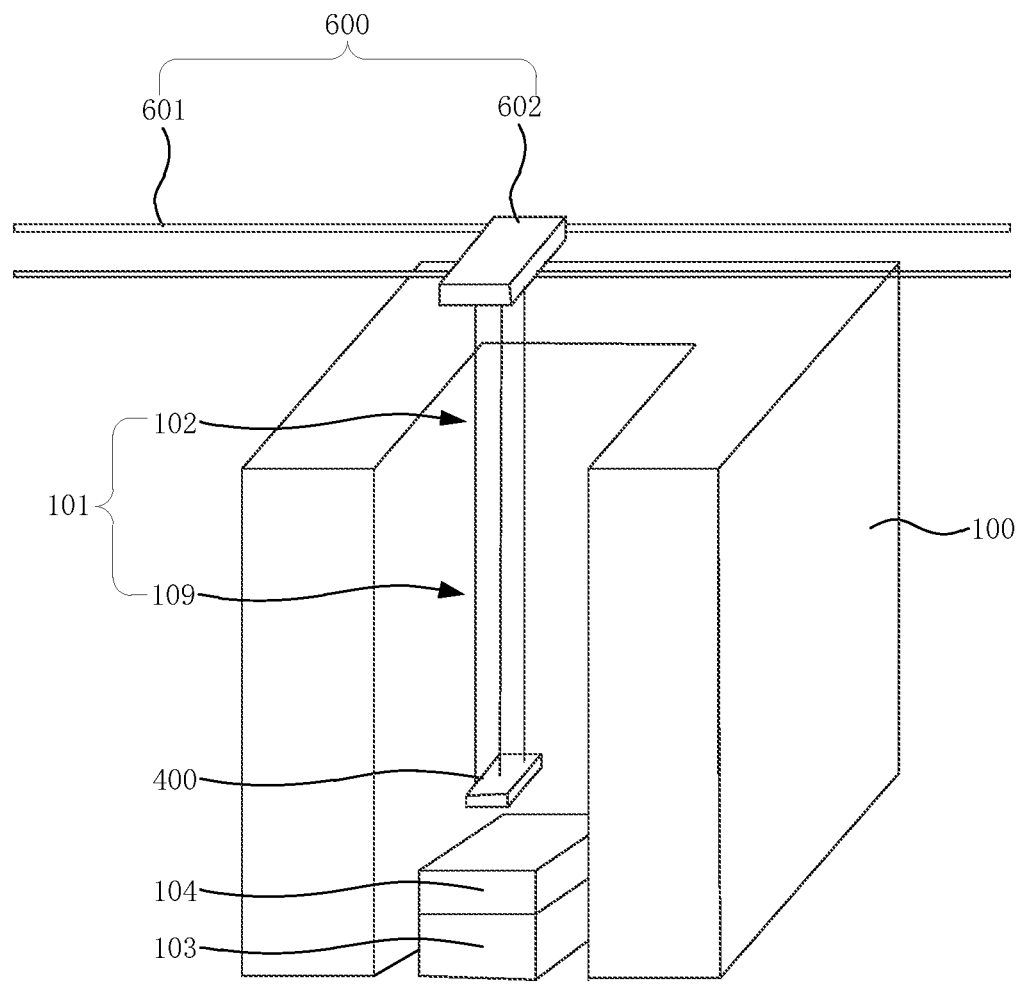
FIG. 1 is a schematic structural diagram of an exposure machine from which a shielding device and door panels are removed according to the embodiment.

Description of reference numerals:

| | |
|---|---|
| 100: Machine platform; | 101: Recess portion; |
| 102: Top opening; | 103: Base; |
| 104: Placement table; | 105: First photoelectric sensor; |
| 106: Second photoelectric sensor; | 107: Third photoelectric sensor; |
| 108: Fourth photoelectric sensor; | 109: Front side opening; |
| 110: Door panel; | 111: Rotation shaft; |
| 112: Pin; | 113: Proximity switch; |
| 200: Shielding device; | 201: First baffle plate; |
| 202: Second baffle plate; | 203: First reflection area; |
| 204: Second reflection area; | 205: Third reflection area; |
| 206: Fourth reflection area; | 300: Drive device; |
| 301: Input shaft; | 302: Coding disc; |
| 303: Black stripe; | 304: Light source; |
| 305: Light receiving element; | 306: First motor; |
| 307: Second motor; | 400: Mask carrier; |
| 500: Transmission device; | 501: First gear; |
| 502: First rack; | 503: Second gear; |
| 504: Second rack; | 600: Running device; |
| 601: Running track; | 602: Running vehicle; |
| 700: Control unit; | 80a: Automatic mode indicator; |
| 80b: Manual mode indicator; | 900: Alarm device. |

DETAILED DESCRIPTION

In the related art, the exposure machine is provided with a recess portion, a top of the recess portion has a top opening, a front side of the recess portion has a front side opening, a movable placement table is disposed inside the recess portion, and a mask outside the exposure machine may be placed on the placement table through the top opening or the front side opening, and then enter the inside of the exposure machine.

However, particles in the environment may enter through the top opening and fall on the placement table, to further contaminate the mask on the placement table. Consequently, a product yield rate after wafer exposure is reduced. For this, embodiments of the present application provide an exposure machine, the exposure machine includes a machine platform, a shielding device, and a drive device, the machine platform is provided with a recess portion, the recess portion has a top opening, a base and a placement table placed on the base are disposed in the recess portion, the machine platform is further provided with a drive device and a movable shielding device, the drive device is in transmission connection with the shielding device, when the shielding device is at an initial position, the shielding device covers the top opening, to prevent particles from entering through the top opening and falling on the placement table, and when a mask needs to be placed on the placement table through the top opening, the drive device opens the shielding device to expose the top opening, so that the mask can be smoothly placed on the placement table through the top opening, and there are almost no particles on the mask on the placement table. In this case, a product yield rate after wafer exposure is high.

To make the above objectives, features, and advantages of the embodiments of the present application clearer, the technical solutions in the embodiments of the present application are clearly and completely described below with reference to the accompanying drawings in the embodiments of the present application. Apparently, the described embodiments are some rather than all of the embodiments of the present application. All other embodiments obtained by a person of ordinary skill in the art based on the embodiments of the present application without creative efforts shall fall within the protection scope of the present application. Each embodiment or implementation in the specification is described in a progressive manner. Each embodiment focuses on the difference from other embodiments, and the same and similar parts between the embodiments may refer to each other.

Referring to FIG. 1, the embodiment provides an exposure machine, including a machine platform 100, the machine platform 100 is provided with a recess portion 101, the recess portion 101 has a top opening 102, a base 103 and a placement table 104 are disposed in the recess portion 101, the placement table 104 is disposed on the base 103 and can ascend and descend, the placement table 104 is configured to carry a mask carrier 400, the mask carrier 400 is loaded with a mask, and the mask carrier 400 can be placed on the placement table 104 through the top opening 102.

Figure 2:
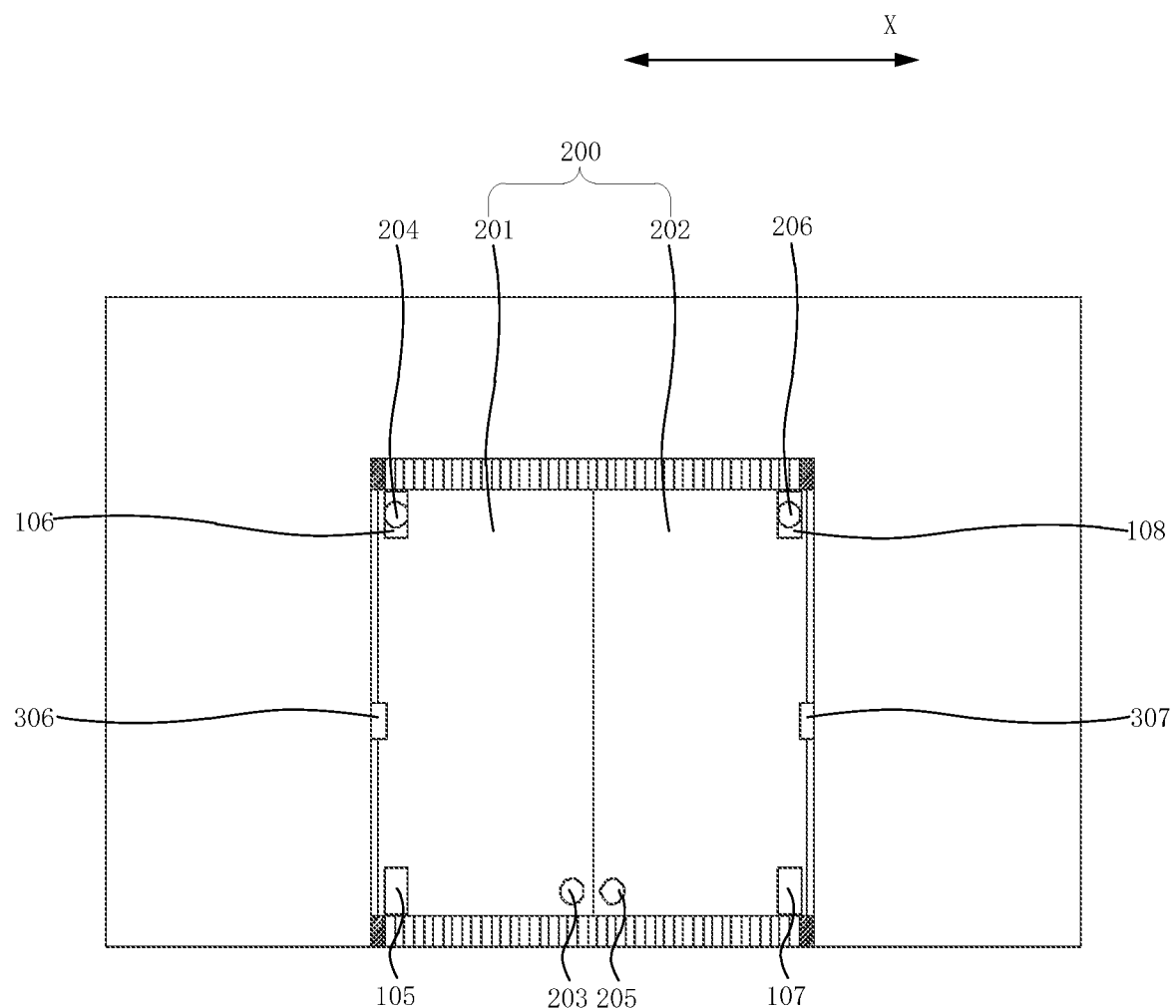
FIG. 2 is a cross-sectional view 1 of an exposure machine according to the embodiment.
Figure 3:
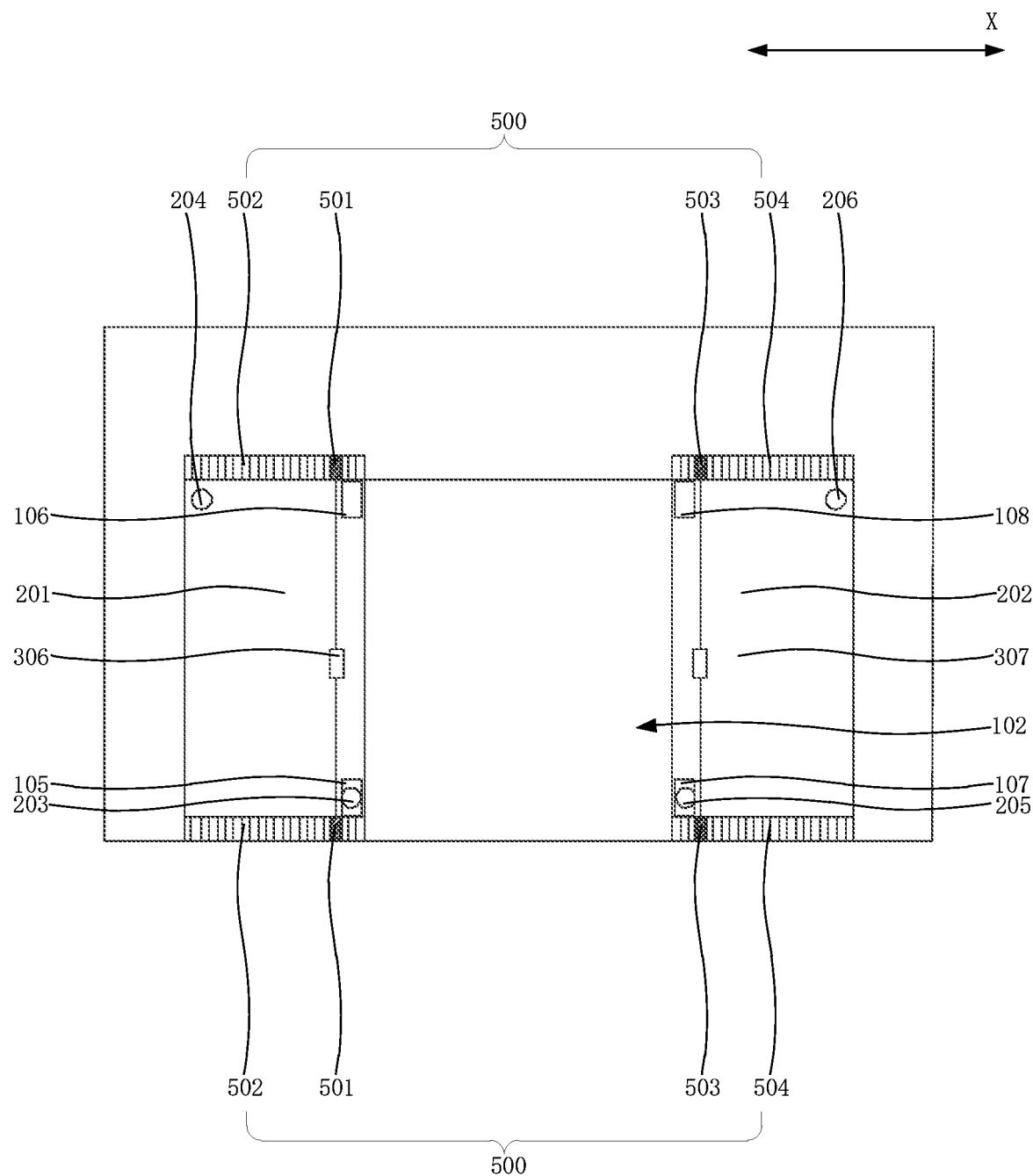
FIG. 3 is a cross-sectional view 2 of an exposure machine according to the embodiment.
Figure 4:
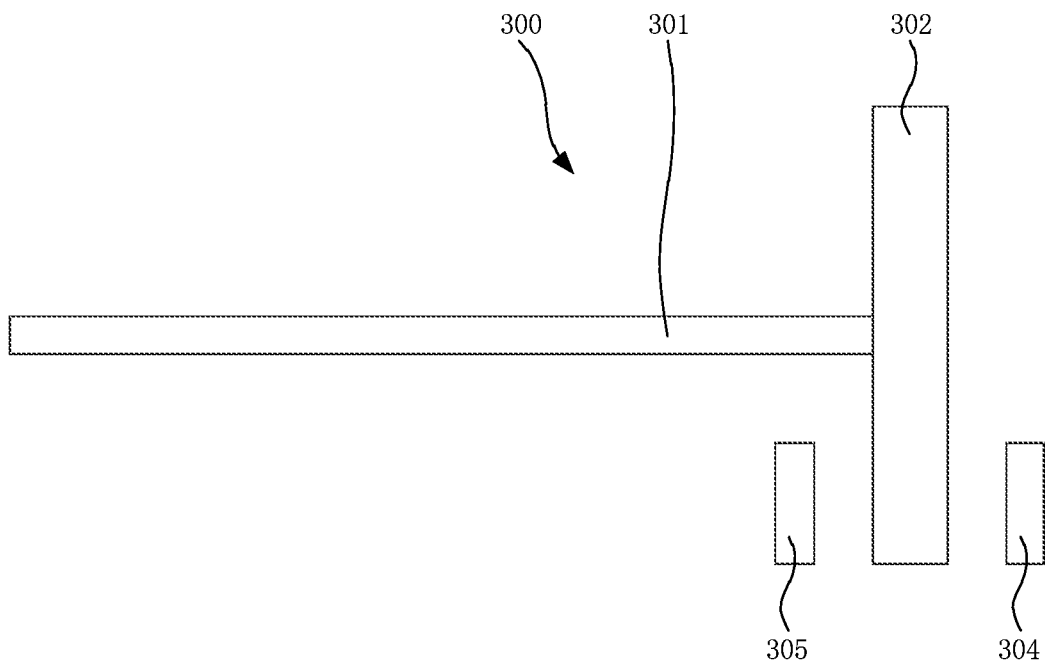
FIG. 4 is a schematic diagram of a servo motor according to the embodiment.

Referring to FIG. 2, FIG. 3, and FIG. 4, the machine platform 100 is further provided with a drive device 300 and a movable shielding device 200, the shielding device 200 may be prepared using transparent resin, the thickness of the shielding device 200 prepared using resin may be 1 mm, and the shielding device 200 prepared using resin has advantages of light weight and high impact resistance. Generally, the density of resin is 0.83-1.5 g/cm³, and the density of optical glass is 2.27-5.95 g/cm³. For shielding devices 200 of a same size, weight of a shielding device 200 prepared using resin is lighter than weight of a shielding device 200 prepared using glass. In addition, the impact resistance capability of resin is several times higher than that of glass, and the impact resistance of resin can reach 8-10 kg/cm². Therefore, the shielding device 200 prepared using resin is less prone to breakage and safer and more durable than the shielding device 200 prepared using glass. In addition, the transparent resin may allow easy observation of an inner work status of the recess portion 101.

The drive device 300 is connected with the shielding device 200. When the shielding device 200 is at an initial position, the shielding device 200 covers the top opening 102, and when the mask carrier 400 needs to be placed on the placement table 104 through the top opening 102, the drive device 300 opens the shielding device 200 to expose the top opening 102, so that the mask carrier 400 can be placed on the placement table 104 through the top opening 102.

In the exposure machine in the embodiments of the present application, the base 103 and the placement table 104 are disposed in the recess portion 101 of the machine platform 100, the placement table 104 is disposed on the base 103 and can ascend and descend, the machine platform 100 is further provided with the drive device 300 and the movable shielding device 200, the shielding device 200 covers the top opening 102 of the recess portion 101 when the shielding device 200 is at an initial position, and when the mask carrier 400 needs to be placed on the placement table 104 through the top opening 102, the drive device 300 opens the shielding device 200 to expose the top opening 102. In this way, when the mask carrier 400 needs to be placed on the placement table 104 through the top opening 102, the drive device 300 can be enabled to open the shielding device 200 to expose the top opening 102, so that the mask carrier 400 can be smoothly placed on the placement table 104, and when the mask carrier 400 does not need to be placed on the placement table 104 through the top opening 102, the shielding device 200 can be enabled to close the top opening 102, to effectively prevent particles entering through the top opening 102 and falling on the placement table 104 in the recess portion 101, so that there are almost no particles on the mask. Therefore, a product yield rate after wafer exposure is improved.

Still referring to FIG. 2, FIG. 3, and FIG. 4, the exposure machine further includes a transmission device 500, the transmission device 500 includes at least one gear and at least one rack that engage with each other, the shielding device 200 includes at least one baffle plate, the baffle plate is tightly connected with the rack, the drive device 300 includes at least one motor, and the gear is disposed on an output shaft of the motor.

The motor may be a servo motor. When receiving a signal amount of one pulse, the servo motor rotates by an angle corresponding to one pulse, so that the rack moves a corresponding displacement. In addition, the servo motor further has a function of sending pulses. Therefore, the servo motor sends a corresponding quantity of pulses for each rotation angle, so that an echo or closed loop is formed with pulses received by the servo motor. In this case, a control unit (which will be mentioned below) in signal connection with the servo motor will learn of the quantity of pulses sent by the servo motor, and will learn of a quantity of pulses received by the servo motor. In this way, rotation of the servo motor can be very precisely controlled. For example, precision may reach 0.001 mm.

Figure 5:
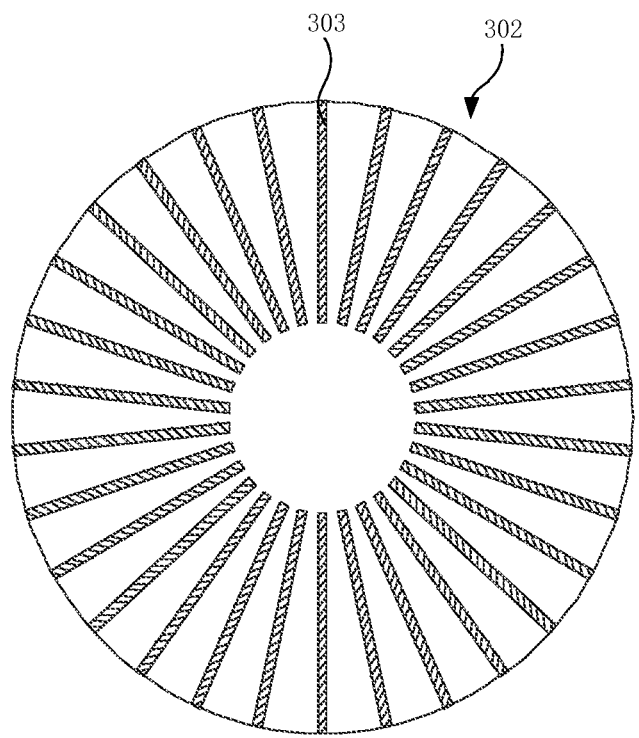
FIG. 5 is a cross-sectional view of a coding disc in FIG. 4.

Referring to FIG. 4 and FIG. 5, an input shaft 301 of the servo motor is mounted with a coding disc 302 made of glass, black stripes 303 that can block light are printed on the coding disc 302, two sides of the coding disc 302 are respectively provided with a light source 304 and a light receiving element 305, and a graduated scale is further disposed between the light receiving element 305 and the light source 304. When the coding disc 302 rotates, light emitted by the light source 304 passes through when encountering transparent glass and is blocked when encountering the black stripes 303. The light receiving element 305 converts the presence or absence of the light into an electrical signal, which becomes a pulse sent by the servo motor. The density of the black stripes 303 on the disc is equal to the resolution of the servo motor. A rotation amount of the coded disc 302 can be grasped based on a quantity of black stripes 303 encountered by the light emitted by the light source 304. Certainly, the black stripes 303 include stripes representing a rotation amount, stripes representing a rotation direction, and stripes representing a reference per rotation, and a position, a rotation amount, and a rotation direction that are of the coding disc 302 can be grasped based on the three types of stripes, so that a position, a rotation amount, and a rotation direction that are of the servo motor can be grasped.

In the exposure machine in the embodiment, the transmission device 500 includes the at least one gear and the at least one rack that engage with each other, the drive device 300 includes the at least one motor, the gear is disposed on the output shaft of the motor, and the rack that engages with the gear is connected with the baffle plate of the shielding device 200. In this way, the motor can drive, by using the gear and the rack, the baffle plate to move, to further open the baffle plate to expose the top opening 102, or close the top opening 102.

Referring to FIG. 2 and FIG. 3, the transmission device 500 includes a first gear 501 and a first rack 502 that engage with each other, and a second gear 503 and a second rack 504 that engage with each other; the shielding device 200 includes a first baffle plate 201 and a second baffle plate 202 that move towards or away from each other, the first rack 502 is disposed on an edge of the first baffle plate 201, and the second rack 504 is disposed on an edge of the second baffle plate 202; and the drive device 300 includes a first motor 306 and a second motor 307, the first gear 501 is disposed on an output shaft of the first motor 306, and the second gear 503 is disposed on an output shaft of the second motor 307.

A quantity of first racks 502 disposed on the first baffle plate 201 is two. One first rack 502 is disposed on a side of the first baffle plate 201 that is close to the front of the machine platform 100, and the other first rack 502 is disposed on a side of the first baffle plate 201 that is close to the rear of the machine platform 100. Extension directions of the two first racks 502 are consistent, and both the two first racks 502 are in a direction in which the first baffle plate 201 moves towards the second baffle plate 202 or away from the second baffle plate 202. The direction in which the first baffle plate 201 moves towards the second baffle plate 202 or away from the second baffle plate 202 is an X direction shown in FIG. 3. Correspondingly, the transmission device 500 includes two first gears 501, each first gear 501 and one first rack 502 engage with each other, one first gear 501 may be disposed on the output shaft of the first motor 306, and the other first gear 501 may be disposed on a transmission shaft connected with the output shaft of the first motor 306.

A quantity of second racks 504 disposed on the second baffle plate 202 is two. One second rack 504 is disposed on a side of the second baffle plate 202 that is close to the front of the machine platform 100, and the other second rack 504 is disposed on a side of the second baffle plate 202 that is close to the rear of the machine platform 100. Extension directions of the two second racks 504 are consistent, and both the two second racks 504 are in a direction in which the second baffle plate 202 moves towards the first baffle plate 201 or away from the first baffle plate 201. The direction in which the second baffle plate 202 moves towards the first baffle plate 201 or away from the first baffle plate 201 is an X direction shown in FIG. 3. Correspondingly, the transmission device 500 includes two second gears 503, and each second gear 503 and one second rack 504 engage with each other. One second gear 503 may be disposed on the output shaft of the second motor 307, and the other second gear 503 may be disposed on a transmission shaft connected with the output shaft of the second motor 307.

In the exposure machine in the embodiment, the transmission device 500 includes the first gear 501 and the first rack 502 that engage with each other, and the second gear 503 and the second rack 504 that engage with each other, the shielding device 200 includes the first baffle plate 201 and the second baffle plate 202 that move towards and away from each other, the first rack 502 is disposed on an edge of the first baffle plate 201, the first rack 502 and the first gear 501 on the output shaft of the first motor 306 engage with each other, the second rack 504 is disposed on an edge of the second baffle plate 202, and the second rack 504 and the second gear 503 on the output shaft of the second motor 307 engage with each other. In this way, the first baffle plate 201 and the second baffle plate 202 move towards each other, and the top opening 102 is in a closed state. In this case, particles can be prevented from entering through the top opening 102 and falling on the placement table 104, to further effectively prevent particles from contaminating the mask, so that a product yield rate after wafer exposure is high. In addition, the first baffle plate 201 and the second baffle plate 202 move away from each other, and the top opening 102 is in an opening state. In this case, the mask can enter through the top opening 102 and be placed on the placement table 104, to further enter the inside of the exposure machine.

Referring to FIG. 2 and FIG. 3, the first baffle plate 201 is provided with a first reflection area 203 and a second reflection area 204. The first reflection area 203 is located at an edge of the first baffle plate 201 that is close to the second baffle plate 202, and the first reflection area 203 may be disposed on an edge of the first baffle plate 201 that is close to the front of the machine platform 100. The second reflection area 204 is located at an edge of the first baffle plate 201 that is away from the second baffle plate 202, and the second reflection area 204 may be disposed on an edge of the first baffle plate 201 that is close to the rear of the machine platform 100. The second baffle plate 202 is provided with a third reflection area 205 and a fourth reflection area 206. The third reflection area 205 is located at an edge of the second baffle plate 202 that is close to the first baffle plate 201, and the third reflection area 205 may be disposed on an edge of the first baffle plate 201 that is close to the front of the machine platform 100. The fourth reflection area 206 is located at an edge of the second baffle plate 202 that is away from the first baffle plate 201, and the fourth reflection area 206 may be disposed on an edge of the second baffle plate 202 that is close to the rear of the machine platform 100.

A first photoelectric sensor 105 and a second photoelectric sensor 106 are disposed on a first edge of the top opening 102, and a third photoelectric sensor 107 and a fourth photoelectric sensor 108 are disposed on a second edge of the top opening 102. The first edge of the top opening 102 and the second edge of the top opening 102 are oppositely disposed. In addition, the first edge of the top opening 102 is disposed on an edge of a top of the machine platform 100 that is close to the second reflection area 204, and the second edge of the top opening 102 is disposed on an edge of the top of the machine platform 100 that is close to the fourth reflection area 206.

When light emitted by the first photoelectric sensor 105 is reflected by the first reflection area 203, and when light emitted by the third photoelectric sensor 107 is reflected by the third reflection area 205, the first photoelectric sensor 105 and the third photoelectric sensor 107 detect that the drive device 300 has completely opened the first baffle plate 201 and the second baffle plate 202 at the top opening 102; and when light emitted by the second photoelectric sensor 106 is reflected by the second reflection area 204, and when light emitted by the fourth photoelectric sensor 108 is reflected by the fourth reflection area 206, the second photoelectric sensor 106 and the fourth photoelectric sensor 108 detect that the drive device 300 has completely closed the first baffle plate 201 and the second baffle plate 202 at the top opening 102.

The following describes a working principle of a photoelectric sensor.

The photoelectric sensor includes a light-emitting diode and a phototransistor. A light beam axis of the light-emitting diode and a light beam axis of the phototransistor are in a plane and form a particular angle, and the light beam axis of the light-emitting diode and the light beam axis of the phototransistor intersect at a point. When the surface of an object to be detected is close to the intersection point, reflected light of the light-emitting diode is received by the phototransistor, to generate an electrical signal. When the object to be detected is away from the intersection point, a light reflection area is not within an angle of view of the phototransistor, and a detection circuit has no output. Since the photoelectric sensor can perform detection in a non-contact manner, a detected object will not be worn and damaged. In addition, the photoelectric sensor does not use a contact to output a signal, so that a service life is long.

In the exposure machine in the embodiment, the first reflection area 203 close to the second baffle plate 202 is disposed on an edge of the first baffle plate 201, the second reflection area 204 away from the second baffle plate 202 is disposed on an edge of the first baffle plate 201, the third reflection area 205 close to the first baffle plate 201 is disposed on an edge of the second baffle plate 202, the fourth reflection area 206 away from the first baffle plate 201 is disposed on an edge of the second baffle plate 202, the first photoelectric sensor 105 and the second photoelectric sensor 106 are disposed on the first edge of the top opening 102, and the third photoelectric sensor 107 and the fourth photoelectric sensor 108 are disposed on the second edge of the top opening 102. In this way, after light emitted by the first photoelectric sensor 105 is reflected by the first reflection area 203, and light emitted by the third photoelectric sensor 107 is reflected by the third reflection area 205, it indicates that the first photoelectric sensor 105 and the third photoelectric sensor 107 detect that the drive device 300 has completely opened the first baffle plate 201 and the second baffle plate 202 at the top opening 102, and after light emitted by the second photoelectric sensor 106 is reflected by the second reflection area 204, and light emitted by the fourth photoelectric sensor 108 is reflected by the fourth reflection area 206, it indicates that the second photoelectric sensor 106 and the fourth photoelectric sensor 108 detect that the drive device 300 has completely closed the first baffle plate 201 and the second baffle plate 202 at the top opening 102.

In some implementations, the first baffle plate 201 is provided with a first through hole and a second through hole, the first through hole is located at an edge of the first baffle plate 201 that is close to the second baffle plate 202, the first through hole may be disposed on an edge of the first baffle plate 201 that is close to the front of the machine platform 100, the second through hole is located at an edge of the first baffle plate 201 that is away from the second baffle plate 202, and the second through hole may be disposed on an edge of the first baffle plate 201 that is close to the rear of the machine platform 100; and the second baffle plate 202 is provided with a third through hole and a fourth through hole, the third through hole is located at an edge of the second baffle plate 202 that is close to the first baffle plate 201, the third through hole may be disposed on an edge of the second baffle plate 202 that is close to the front of the machine platform 100, the fourth through hole is located at an edge of the second baffle plate 202 that is away from the first baffle plate 201, and the fourth through hole may be disposed on an edge of the second baffle plate 202 that is close to the rear of the machine platform 100.

A first photoelectric sensor 105 and a second photoelectric sensor 106 are disposed on a first edge of the top opening 102, and a third photoelectric sensor 107 and a fourth photoelectric sensor 108 are disposed on a second edge of the top opening 102. The first edge of the top opening 102 and the second edge of the top opening 102 are oppositely disposed. In addition, the first edge of the top opening 102 is disposed on an edge of the top of the machine platform 100 that is close to the second through hole, and the second edge of the top opening 102 is disposed on an edge of the top of the machine platform 100 that is close to the fourth through hole.

When light emitted by the first photoelectric sensor 105 emits through the first through hole, and when light emitted by the third photoelectric sensor 107 emits through the third through hole, the first photoelectric sensor 105 and the third photoelectric sensor 107 detect that the drive device 300 has completely opened the first baffle plate 201 and the second baffle plate 202 at the top opening 102; and when light emitted by the second photoelectric sensor 106 emits through the second through hole, and when light emitted by the fourth photoelectric sensor 108 emits through the fourth through hole, the second photoelectric sensor 106 and the fourth photoelectric sensor 108 detect that the drive device 300 has completely closed the first baffle plate 201 and the second baffle plate 202 at the top opening 102.

In the exposure machine in the embodiment, the first through hole close to the second baffle plate 202 is disposed on an edge of the first baffle plate 201, the second through hole away from the second baffle plate 202 is disposed on an edge of the first baffle plate 201, the third through hole close to the first baffle plate 201 is disposed on an edge of the second baffle plate 202, the fourth through hole away from the first baffle plate 201 is disposed on an edge of the second baffle plate 202, the first photoelectric sensor 105 and the second photoelectric sensor 106 are disposed on the first edge of the top opening 102, and the third photoelectric sensor 107 and the fourth photoelectric sensor 108 are disposed on the second edge of the top opening 102. In this way, after light emitted by the first photoelectric sensor 105 emits through the first through hole, and light emitted by the third photoelectric sensor 107 emits through the third through hole, it indicates that the first photoelectric sensor 105 and the third photoelectric sensor 107 detect that the drive device 300 has completely opened the first baffle plate 201 and the second baffle plate 202 at the top opening 102, and after light emitted by the second photoelectric sensor 106 emits through the second through hole, and light emitted by the fourth photoelectric sensor 108 emits through the fourth through hole, it indicates that the second photoelectric sensor 106 and the fourth photoelectric sensor 108 detect that the drive device 300 has completely closed the first baffle plate 201 and the second baffle plate 202 at the top opening 102.

Referring to FIG. 1, the exposure machine further includes a running device 600, the running device 600 includes at least one running track 601 and a running vehicle 602, the running vehicle 602 is disposed on the at least one running track 601, the running vehicle 602 can reciprocate along the at least one running track 601, the at least one running track 601 is disposed above the machine platform 100, and the running vehicle 602 can further grab and release the mask carrier 400.

In the exposure machine in the embodiment, the at least one running track 601 of the running device 600 is disposed above the machine platform 100, the running vehicle 602 is disposed on the at least one running track 601, and the running vehicle 602 performs a reciprocating motion along the at least one running track 601. In this way, after grabbing the mask carrier 400, the running vehicle 602 move to a position above the top opening 102 along the at least one running track 601, and when the drive device 300 completely opens the shielding device 200, the running vehicle 602 releases the mask carrier 400, and places the mask carrier 400 on the placement table 104. Afterwards, the running vehicle 602 returns to an original position along the at least one running track 601, and the drive device 300 completely closes the shielding device 200. In this case, the top opening 102 is closed, and particles cannot enter the recess portion 101 through the top opening 102, so that a probability that the mask is contaminated is low, and a product yield rate after wafer exposure is high.

Figure 6:
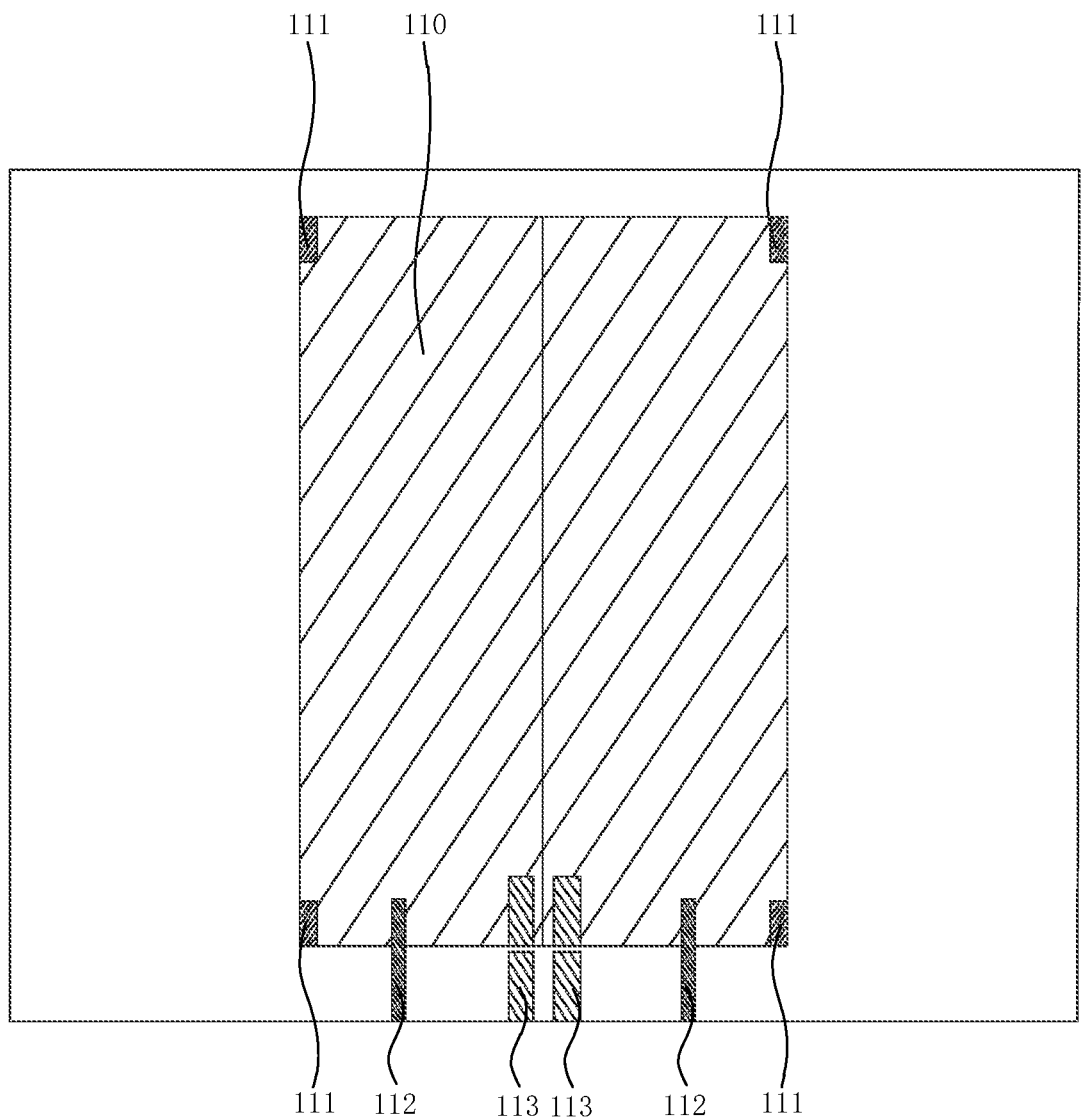
FIG. 6 is a cross-sectional view 3 of an exposure machine according to the embodiment.

Referring to FIG. 1 and FIG. 6, the recess portion 101 further has a front side opening 109; and the exposure machine further includes two door panels 110, and the two door panels 110 are respectively pivotally mounted at two opposite edges of the front side opening 109 of the machine platform 100, to open or close the front side opening 109. The door panels 110 may be of a transparent resin material, and the thickness of the door panels 110 may be 1 mm. The door panels 110 may be manually opened.

A shape of the front side opening 109 is approximately a rectangle, and a first edge of the front side opening 109 and a second edge of the front side opening 109 are each provided with a rotation shaft 111. One door panel 110 is disposed on the rotation shaft 111 disposed on the first edge of the front side opening 109, and the other door panel 110 is disposed on the rotation shaft 111 disposed on the second edge of the front side opening 109. The first edge of the front side opening 109 and the second edge of the front side opening 109 are oppositely disposed.

A quantity of rotation shafts 111 disposed on the first edge of the front side opening 109 may be two, and top and bottom edges of one door panel 110 are rotatably disposed on two rotation shafts 111 disposed on the first edge of the front side opening 109.

A quantity of rotation shafts 111 disposed on the second edge of the front side opening 109 may be two, and top and bottom edges of the other door panel 110 are rotatably disposed on two rotation shafts 111 disposed on the second edge of the front side opening 109.

In the exposure machine in the embodiment, the two door panels 110 are disposed on the front side opening 109 of the recess portion 101, the two door panels 110 are pivotally mounted on the two opposite edges of the front side opening 109, when the door panels 110 are at initial positions, the door panels 110 close the front side opening 109, and when the mask carrier 400 needs to be placed on the placement table 104 through the front side opening 109, the door panels 110 are opened, to expose the front side opening 109. In this way, when the mask carrier 400 needs to be placed on the placement table 104 through the front side opening 109, the door panels 110 are opened to enable the mask carrier 400 to be placed on the placement table 104 through the front side opening 109, and when the mask carrier 400 does not need to be placed on the placement table 104 through the front side opening 109, the door panels 110 are closed to effectively prevent people from performing a misoperation, to protect human beings and the machine platform 100.

Jacks are disposed on the door panels 110 or bottom edge of the front side opening 109, and pins that enable the door panels 110 to keep closing the front side opening 109 are disposed in the jacks. When jacks are disposed on the door panels 110, pins are disposed at bottom edge of the front side opening 109, and when jacks are disposed at the bottom edge of the front side opening 109, pins 112 are disposed on the door panels 110, as shown in FIG. 6.

In the exposure machine in the embodiment, jacks are disposed on the door panels 110 or bottom edge of the front side opening 109, and the pins 112 that enable the door panels 110 to keep closing the front side opening 109 are disposed in the jacks, to enable the door panels 110 to reliably close the front side opening 109, and further effectively protect people and the machine platform 100.

Referring to FIG. 6, each door panel 110 is provided with a proximity switch 113. The proximity switch 113 has a first state and a second state. In the first state, the proximity switches 113 can enable the door panels 110 to keep closing the front side opening 109. In the second state, the proximity switches 113 can enable the door panels 110 to be opened.

The proximity switch 113 is a type of sensor. The proximity switch 113 may be a magnetic proximity switch. In the first state, a distance between the door panel 110 and an edge of the front side opening 109 is less than an effective magnetic attraction distance, magnetic attraction is performed between the door panel 110 and the edge of the front side opening 109 by the proximity switch 113, and the magnetic proximity switch may transfer a current state to a control unit in signal connection with the magnetic proximity switch. In the second state, a distance between the door panel 110 and the edge of the front side opening 109 is greater than the effective magnetic attraction distance, magnetic attraction cannot be performed between the door panel 110 and the edge of the front side opening 109 by the proximity switch 113, and the magnetic proximity switch may also transfer a current state to the control unit connected with the magnetic proximity switch. Certainly, that the proximity switch 113 is in the first state or the second state is that the proximity switch 113 is in an operating state. When the proximity switch 113 is in a non-operating state, the proximity switch 113 has no response to that the distance between the door panel 110 and the edge of the front side opening 109 is the effective magnetic attraction distance, including that magnetic attraction cannot be performed between the door panel 110 and the edge of the front side opening 109 by the proximity switch 113, and that the proximity switch 113 does not transfer a current state to the control unit connected with the proximity switch 113.

Figure 7:
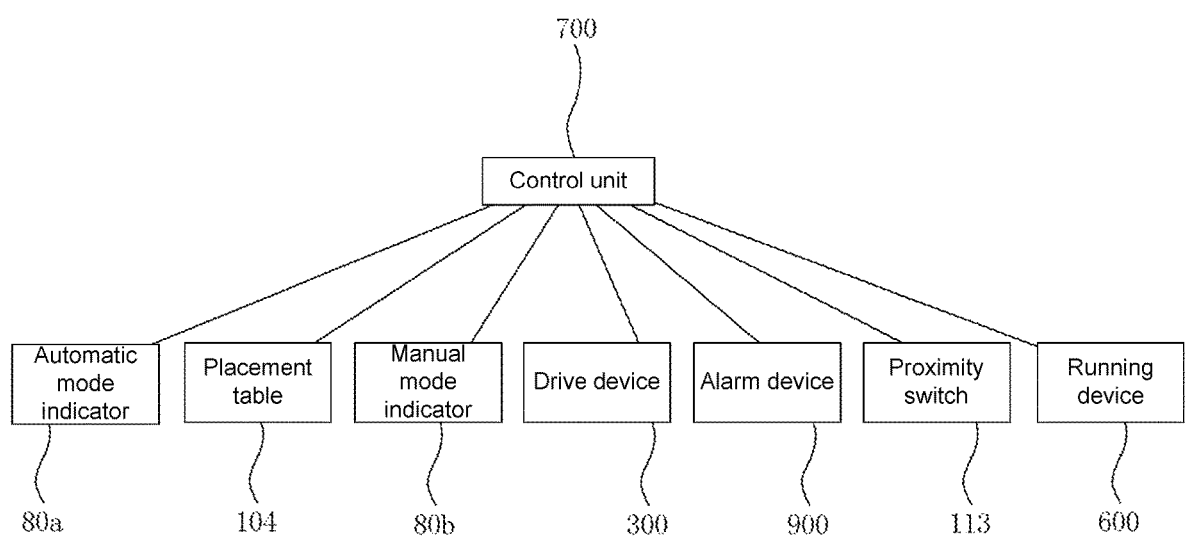
FIG. 7 is a schematic diagram of an exposure machine according to the embodiment.

Referring to FIG. 7, the exposure machine further includes a control unit 700, the control unit 700 is in signal connection with the running device 600, the drive device 300, and the placement table 104, and the control unit 700 may be synchronously connected with the running device 600 by an E84 signal. The exposure machine has an automatic mode, and in the automatic mode: when the running vehicle 602 moves to a first position that is close to the top opening 102, the control unit 700 controls the drive device 300 to completely open the shielding device 200 at the top opening 102, controls the placement table 104 to ascend, and controls the running vehicle 602 to place the carried mask carrier 400 on the placement table 104.

In the exposure machine in the embodiment, the exposure machine has the automatic mode, and in the automatic mode, when the running vehicle 602 moves to the first position that is close to the top opening 102, the control unit 700 controls the drive device 300 to completely open the shielding device 200 at the top opening 102, controls the placement table 104 to ascend, and controls the running vehicle 602 to place the carried mask carrier 400 on the placement table 104. In this way, the shielding device 200 may be automatically opened based on a position of the running vehicle 602, and corporate with ascending of the placement table 104 and releasing of the mask carrier 400 by the running vehicle 602, to improve efficiency.

Referring to FIG. 7, the control unit 700 is further in signal connection with the proximity switches 113. In the automatic mode: when the running vehicle 602 moves to the first position that is close to the top opening 102, and when the proximity switches 113 are in a first state, the control unit 700 controls the drive device 300 to completely open the shielding device 200 at the top opening 102, controls the placement table 104 to ascend, and controls the running vehicle 602 to place the carried mask carrier 400 on the placement table 104.

In the exposure machine in the embodiment, in the automatic mode: when the running vehicle 602 moves to the first position that is close to the top opening 102, and when the proximity switches 113 are in the first state, the control unit 700 controls the drive device 300 to completely open the shielding device 200 at the top opening 102, controls the placement table 104 to ascend, and controls the running vehicle 602 to place the carried mask carrier 400 on the placement table 104. In this way, when the mask carrier 400 needs to be placed on the placement table 104 through the top opening 102, the shielding device 200 at the top opening 102 can be automatically opened at an appropriate moment, so that the mask carrier 400 can be placed on the placement table 104, and particles can be effectively prevent from entering the inside of the exposure machine; and when the mask carrier needs to be placed on the placement table 104 through the top opening 102, the front side opening 109 can be closed, to effectively protect people and the machine platform 100.

Referring to FIG. 7, the exposure machine further includes an automatic mode indicator 80a in signal connection with the control unit 700; and in the automatic mode: when the proximity switches 113 are in the first state, and when the first photoelectric sensor 105 and the third photoelectric sensor 107 detect that the drive device 300 has completely opened the shielding device 200 at the top opening 102, the control unit 700 controls the automatic mode indicator 80a to emit light.

In the exposure machine in the embodiment, in the automatic mode: when the proximity switches 113 are in the first state, and when the first photoelectric sensor 105 and the third photoelectric sensor 107 detect that the drive device 300 has completely opened the shielding device 200 at the top opening 102, the control unit 700 controls the automatic mode indicator 80a to emit light, to help people intuitively and quickly determine, based on the display of the automatic mode indicator 80a, that at this time, the exposure machine is in the automatic mode, the door panels 110 of the front side opening 109 are closed, and the shielding device 200 at the top opening 102 is opened.

Referring to FIG. 7, the exposure machine further includes an alarm device 900 in signal connection with the control unit 700, and the alarm device 900 is configured to generate an alarm signal; and in automatic mode: when the proximity switch 113 is in a second state, the control unit 700 controls the alarm device 900 to generate the alarm signal.

In the exposure machine in the embodiment, in the automatic mode: when the proximity switch 113 is in the second state, the control unit 700 controls the alarm device 900 to generate the alarm signal, to effectively prevent people from performing a misoperation to open the door panel 110, and further protect people and the machine platform 100.

The exposure machine has a manual mode, and in the manual mode: the control unit 700 controls the drive device 300 to close the shielding device 200 at the top opening 102, controls the proximity switches 113 to be in the second state, and controls the placement table 104 to descend, so that the mask carrier 400 can be placed on the placement table 104 through the front side opening 109.

In the exposure machine in the embodiment, in the manual mode: the control unit 700 controls the drive device 300 to close the shielding device 200 at the top opening 102, controls the proximity switches 113 to be in the second state, and controls the placement table 104 to descend, so that the mask carrier 400 can be placed on the placement table 104 through the front side opening 109. In this way, in the manual mode, the drive device 300 can be enabled to close the shielding device 200 at the top opening 102, to effectively prevent particles from contaminating the mask, so that a product yield rate after wafer exposure is high, and the mask can be placed on the placement table 104 through the front side opening 109.

Referring to FIG. 7, the exposure machine further includes a manual mode indicator 80b in signal connection with the control unit 700; and in the manual mode: when the second photoelectric sensor 106 and the fourth photoelectric sensor 108 detect that the drive device 300 has completely closed the shielding device 200 at the top opening 102, and when the proximity switches 113 are in the second state, the control unit 700 controls the manual mode indicator 80b to emit light.

In the exposure machine in the embodiment, in the manual mode: when the second photoelectric sensor 106 and the fourth photoelectric sensor 108 detect that the drive device 300 has completely closed the shielding device 200 at the top opening 102, and when the proximity switches 113 are in the second state, the control unit 700 controls the manual mode indicator 80b to emit light, to help people to intuitively and quickly determine, based on the display of the manual mode indicator 80b, that at this time, the exposure machine is in the manual mode, the door panels 110 of the front side opening 109 are opened, and the shielding device 200 at the top opening 102 is closed.

Figure 8:
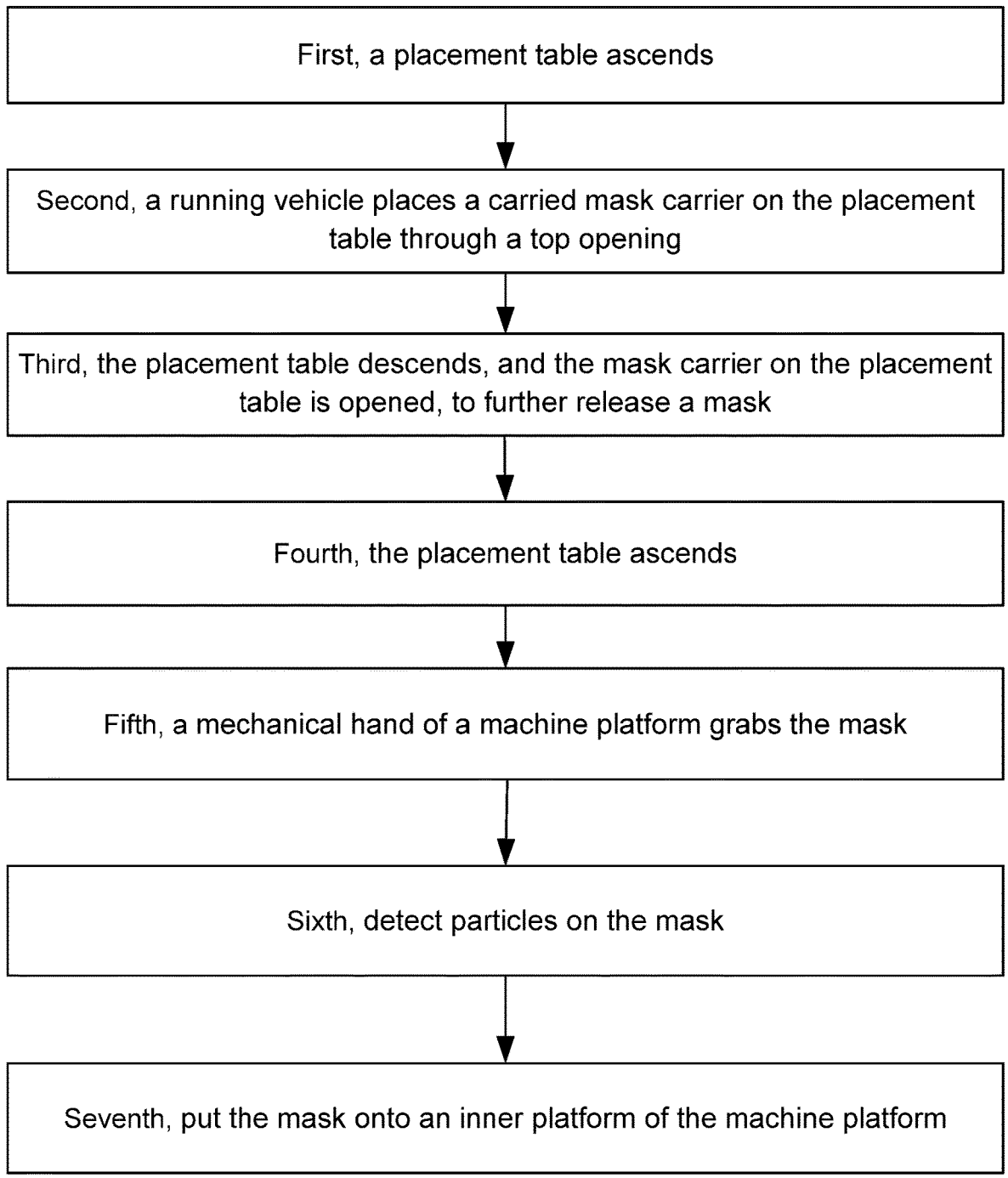
FIG. 8 is a flowchart of an exposure machine that places a mask in an automatic mode according to the embodiment.

Referring to FIG. 8, in the exposure machine in the embodiment, in the automatic mode, a procedure of placing the mask on the placement table 104 is: First, the placement table 104 ascends; second, the running vehicle 602 places the carried mask carrier 400 on the placement table 104 through the top opening 102; third, the placement table 104 descends, and the mask carrier 400 on the placement table 104 is opened, to further release the mask; fourth, the placement table 104 ascends; fifth, a mechanical hand of the machine platform 100 grabs the mask; sixth, detect particles on the mask; and seventh, put the mask onto an inner platform of the machine platform 100.

Figure 9:
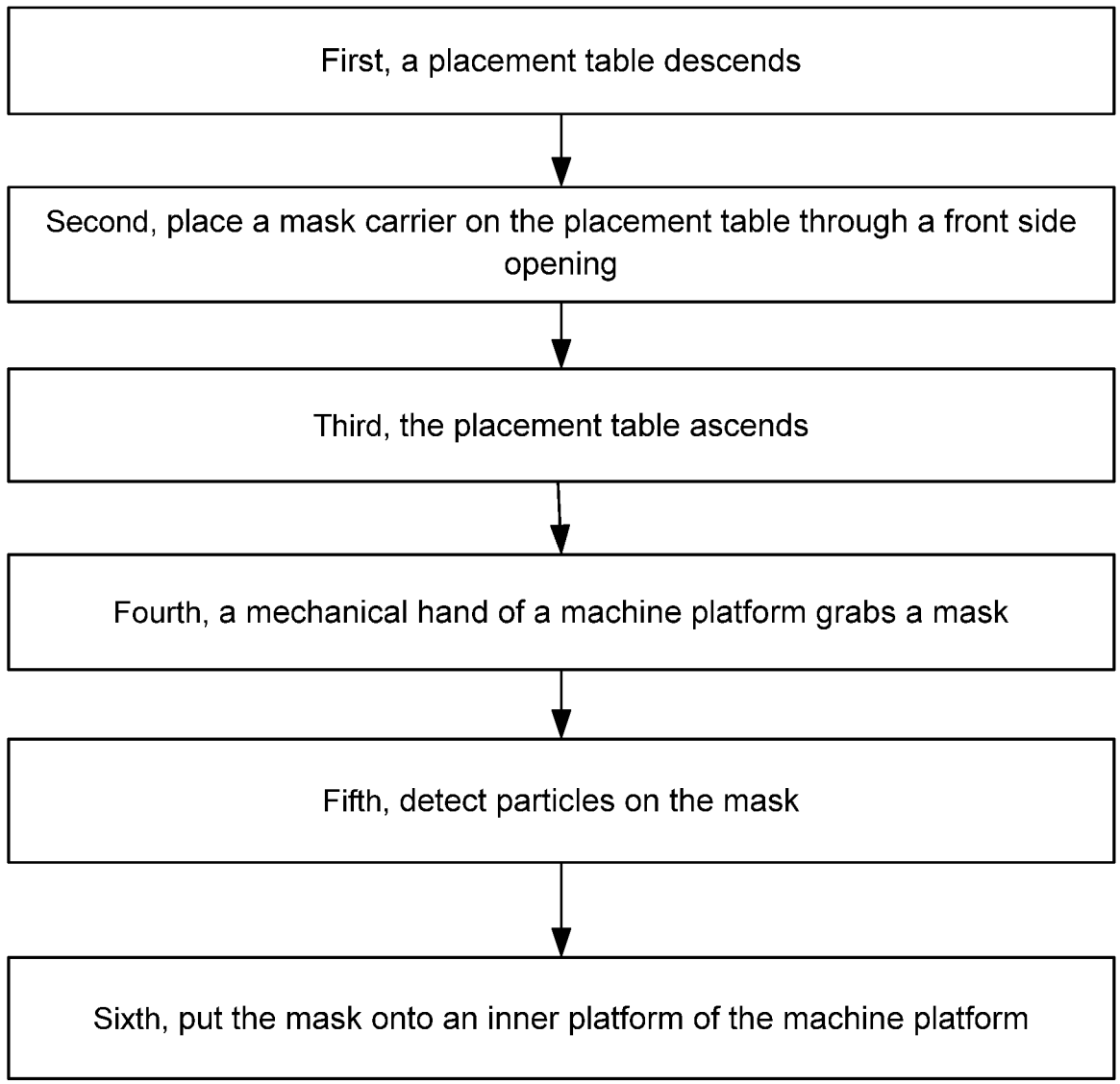
FIG. 9 is a flowchart of an exposure machine that places a mask in a manual mode according to the embodiment.

Referring to FIG. 9, in the exposure machine in the embodiment, in the manual mode, a procedure of placing the mask on the placement table 104 is: First, the placement table 104 descends; second, place the mask carrier 400 on the placement table 104 through the front side opening 109, and open the mask carrier 400 at this position, to further release the mask; third, the placement table 104 ascends; fourth, a mechanical hand of the machine platform 100 grabs the mask; fifth, detect particles on the mask; and sixth, put the mask onto an inner platform of the machine platform 100.

It should be noted that, in the exposure machine in the embodiment, in the manual mode and in the automatic mode, the mask carrier 400 is placed on the placement table 104, but in the manual mode, a position at which the mask carrier 400 is placed is a position at which the mask carrier 400 is opened, and in the automatic mode, a position at which the mask carrier 400 is placed and a position at which the mask carrier 400 is opened are different positions. In the manual mode, the mask carrier 400 is placed on the placement table 104 by a handling device disposed on the machine platform 100 instead of being carried by people by hands. In this way, the mask can be further prevented from being contaminated. In addition, the exposure machine in the embodiment usually places the mask carrier 400 on the placement table 104 in the automatic mode, and usually places the mask carrier 400 on the placement table 104 in the manual mode in cases of restart, maintenance, and the like after an exposure machine failure.

Figure 10:
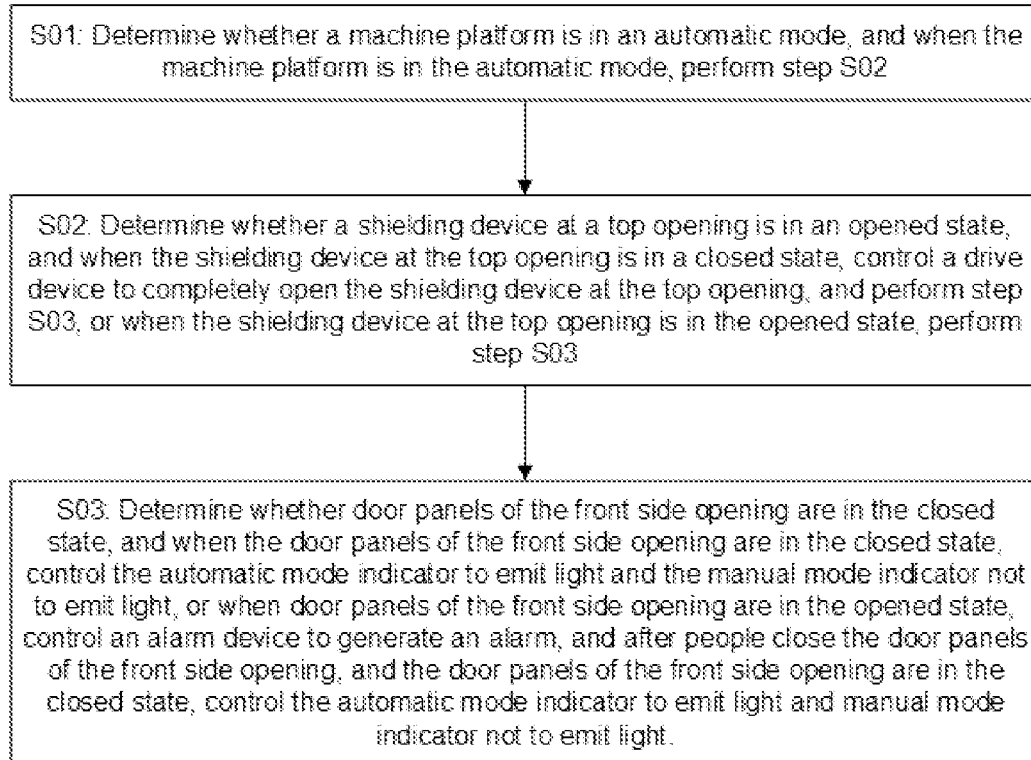
FIG. 10 is a flowchart of a control method for controlling a shielding device and a proximity switch by an exposure machine in an automatic mode according to the embodiment.

Referring to FIG. 10, in the exposure machine in the embodiment, in the automatic mode, a controlling method of the exposure machine includes the following steps.

S01: Determine whether the machine platform 100 is in the automatic mode, and when the machine platform 100 is in the automatic mode, perform step S02.

S02: Determine whether the shielding device 200 at the top opening 102 is in the opened state, and when the shielding device 200 at the top opening 102 is in the opened state, perform step S03.

S03: Determine whether the door panels 110 of the front side opening 109 are in the closed state, and when the door panels 110 of the front side opening 109 are in the closed state, control the automatic mode indicator 80a to emit light and the manual mode indicator 80b not to emit light, or when the door panels 110 of the front side opening 109 are in the opened state, control the alarm device 900 to generate an alarm, and after people close the door panels 110 of the front side opening 109, and the door panels 110 of the front side opening 109 are in the closed state, control the automatic mode indicator 80a to emit light and the manual mode indicator 80b not to emit light.

In step S02, when the shielding device at the top opening 102 is in the closed state, the drive device 300 is controlled to open the shielding device 200 at the top opening 102, and when the shielding device 200 at the top opening 102 is completely opened, the drive device 300 is controlled to stop running.

Figure 11:
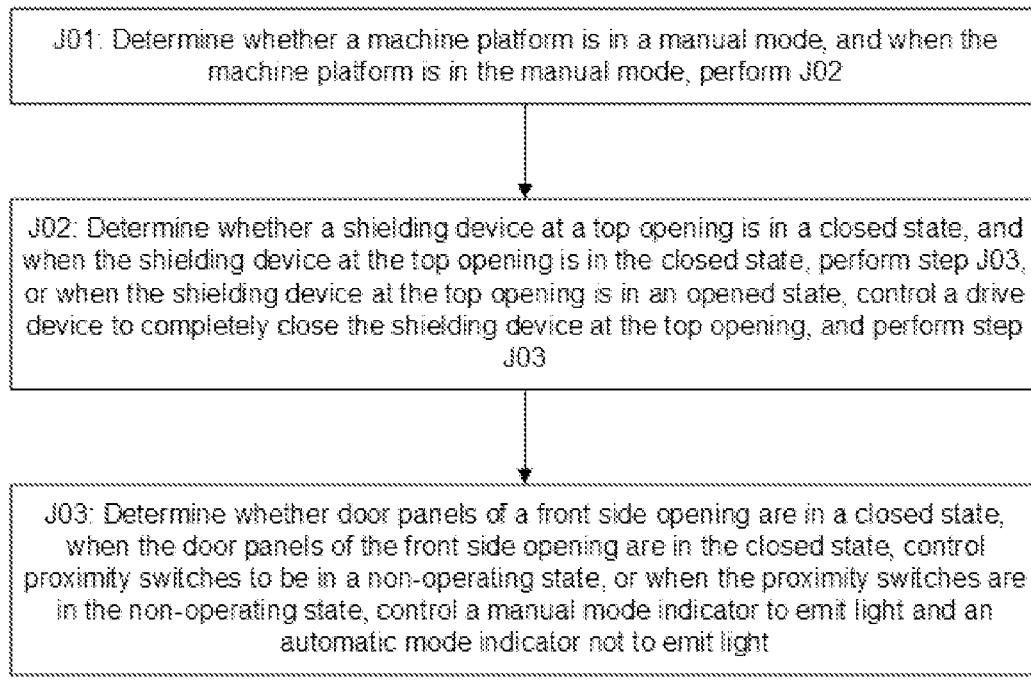
FIG. 11 is a flowchart of a control method for controlling a shielding device and a proximity switch by an exposure machine in a manual mode according to the embodiment.

Referring to FIG. 11, in the exposure machine in the embodiment, in the manual mode, a controlling method of the exposure machine includes the following steps.

J01: Determine whether the machine platform 100 is in the manual mode, and when the machine platform 100 is in the manual mode, perform J02.

J02: Determine whether the shielding device 200 at the top opening 102 is in the closed state, and when the shielding device 200 at the top opening 102 is in the closed state, perform step J03.

J03: Determine whether the door panels 110 of the front side opening 109 are in the closed state, when the door panels 110 of the front side opening 109 are in the closed state, control the proximity switches 113 to be in a non-operating state, and when the proximity switches 113 are in the non-operating state, control the manual mode indicator 80b to emit light and the automatic mode indicator 80a not to emit light.

In step J02, when the shielding device 200 at the top opening 102 is in the opened state, the drive device 300 is controlled to close the shielding device 200 at the top opening 102, and when the shielding device 200 at the top opening 102 is completely closed, the drive device 300 is controlled to stop running.

Figure 12:
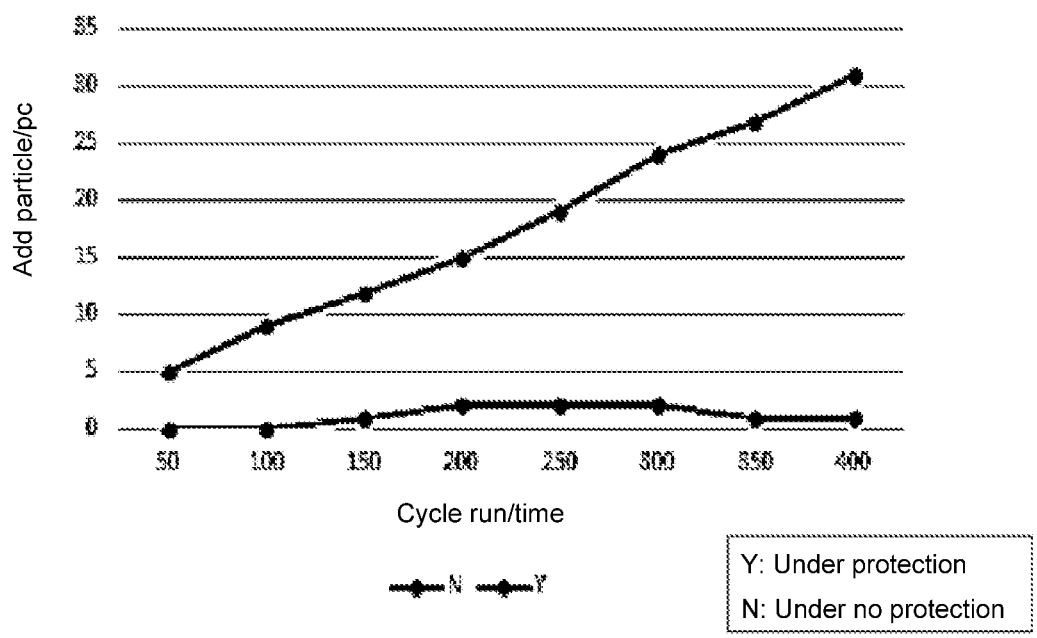
FIG. 12 is a schematic diagram of a quantity of particles on a wafer in an exposure machine according to the embodiment and a quantity of particles on a wafer of an exposure machine in the prior art.

Referring to FIG. 12, FIG. 12 is a schematic diagram of a quantity of particles on a wafer when the shielding device 200 is disposed on the top of the machine platform 100, and FIG. 12 is further a schematic diagram of a quantity of particles on the wafer when the shielding device 200 is not disposed on the top of the machine platform 100. It can be learned from FIG. 12 that, after the shielding device 200 is disposed on the machine platform 100, particles on the wafer are reduced. In this way, defects that occur after wafer exposure are reduced and a wafer product yield rate is improved.

In the exposure machine in the embodiment, the movable shielding device 200 is disposed on the machine platform 100, and when the shielding device 200 is in an original position, the shielding device 200 covers the top opening 102. This can significantly reduce a probability that defects occur after wafers are exposed, thereby improving a product yield rate of the exposed wafers.

In the description of this specification, the description with reference to the terms such as "one embodiment", "some embodiments", "an example", "a specific example", or "some examples" means that the specific features, structures, materials, or characteristics described with reference to the embodiment or example are included in at least one embodiment or example of the present application. In this specification, the illustrative expressions of the above terms do not necessarily refer to a same embodiment or example. Furthermore, the specific features, structures, materials, or characteristics described may be combined in a suitable manner in any one or more of embodiments or examples. In addition, a person skilled in the art may combine different embodiments or examples described in this specification and features of the different embodiments or examples without mutual contradiction.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the scope of the technical solutions of the embodiments of the present application.

The invention claimed is:

1. An exposure machine, comprising a machine platform, a movable shielding device, a drive device, and a transmission device, wherein
the machine platform is provided with a recess portion, the recess portion has a top opening, a base and a placement table are disposed in the recess portion, the placement table is disposed on the base and is configured to ascend and descend, the placement table is configured to carry a mask carrier, the mask carrier is loaded with a mask, and the mask carrier is configured to be placed on the placement table through the top opening;
the machine platform is further provided with the drive device and the movable shielding device, the drive device is connected with the movable shielding device, when the movable shielding device is at an initial position, the movable shielding device covers the top opening, and when the mask carrier needs to be placed on the placement table through the top opening, the drive device opens the movable shielding device to expose the top opening to enable the mask carrier to be placed on the placement table through the top opening;
the transmission device comprises a first gear and a first rack that engage with each other and a second gear and a second rack that engage with each other;
the movable shielding device comprises a first baffle plate and a second baffle plate that move towards or away from each other, the first rack is disposed on an edge of the first baffle plate, and the second rack is disposed on an edge of the second baffle plate; and
the drive device comprises a first motor and a second motor, the first gear is disposed on an output shaft of the first motor, and the second gear is disposed on an output shaft of the second motor.

2. The exposure machine according to claim 1, wherein the first baffle plate is provided with a first through hole and a second through hole, the first through hole is located at an edge of the first baffle plate that is close to the second baffle plate, and the second through hole is located at an edge of the first baffle plate that is away from the second baffle plate; and the second baffle plate is provided with a third through hole and a fourth through hole, the third through hole is located at an edge of the second baffle plate that is close to the first baffle plate, and the fourth through hole is located at an edge of the second baffle plate that is away from the first baffle plate;
a first photoelectric sensor and a second photoelectric sensor are disposed on a first edge of the top opening, and a third photoelectric sensor and a fourth photoelectric sensor are disposed on a second edge of the top opening;
when light emitted by the first photoelectric sensor emits through the first through hole, and when light emitted by the third photoelectric sensor emits through the third through hole, the first photoelectric sensor and the third photoelectric sensor detect that the drive device has completely opened the first baffle plate and the second baffle plate at the top opening; and
when light emitted by the second photoelectric sensor emits through the second through hole, and when light emitted by the fourth photoelectric sensor emits through the fourth through hole, the second photoelectric sensor and the fourth photoelectric sensor detect that the drive device has completely closed the first baffle plate and the second baffle plate at the top opening.

3. The exposure machine according to claim 1, wherein the first baffle plate is provided with a first reflection area and a second reflection area, the first reflection area is located at an edge of the first baffle plate that is close to the second baffle plate, and the second reflection area is located at an edge of the first baffle plate that is away from the second baffle plate; and the second baffle plate is provided with a third reflection area and a fourth reflection area, the third reflection area is located at an edge of the second baffle plate that is close to the first baffle plate, and the fourth reflection area is located at an edge of the second baffle plate that is away from the first baffle plate;
a first photoelectric sensor and a second photoelectric sensor are disposed on a first edge of the top opening, and a third photoelectric sensor and a fourth photoelectric sensor are disposed on a second edge of the top opening;
when light emitted by the first photoelectric sensor is reflected by the first reflection area, and when light emitted by the third photoelectric sensor is reflected by the third reflection area, the first photoelectric sensor and the third photoelectric sensor detect that the drive device has completely opened the first baffle plate and the second baffle plate at the top opening; and
when light emitted by the second photoelectric sensor is reflected by the second reflection area, and when light emitted by the fourth photoelectric sensor is reflected by the fourth reflection area, the second photoelectric sensor and the fourth photoelectric sensor detect that the drive device has completely closed the first baffle plate and the second baffle plate at the top opening.

4. The exposure machine according to claim 2, wherein the exposure machine further comprises a running device; and
the running device comprises at least one running track and a running vehicle, the running vehicle is disposed on the at least one running track, and the running vehicle is configured to reciprocate along the at least one running track, the at least one running track is disposed above the machine platform, and the running vehicle is configured to further grab and release the mask carrier.

5. The exposure machine according to claim 3, wherein the exposure machine further comprises a running device; and
The running device comprises at least one running track and a running vehicle, the running vehicle is disposed on the at least one running track, and the running vehicle is configured to reciprocate along the at least one running track, the at least one running track is disposed above the machine platform, and the running vehicle is configured to further grab and release the mask carrier.

6. The exposure machine according to claim 4, wherein the recess portion further has a front side opening; and
the exposure machine further comprises two door panels, and the two door panels are respectively pivotally mounted at two opposite edges of the front side opening of the machine platform, to open or close the front side opening.

7. The exposure machine according to claim 6, wherein the two door panels or a bottom edge of the front side opening is provided with jacks, and the jacks are provided with pins that enable the two door panels to keep closing the front side opening.

8. The exposure machine according to claim 6, wherein each of the two door panels is provided with a proximity switch, the proximity switch has a first state and a second state, in the first state, the proximity switches are configured to enable the two door panels to keep closing the front side opening, and in the second state, the proximity switches are configured to enable the two door panels to be opened.

9. The exposure machine according to claim 7, wherein each of the two door panels is provided with a proximity switch, the proximity switch has a first state and a second state, in the first state, the proximity switches are configured to enable the two door panels to keep closing the front side opening, and in the second state, the proximity switches are configured to enable the two door panels to be opened.

10. The exposure machine according to claim 8, wherein the exposure machine further comprises a control unit, and the control unit is in signal connection with the running device, the drive device, and the placement table; and
the exposure machine has an automatic mode, and in the automatic mode:
when the running vehicle moves to a first position close to the top opening, the control unit controls the drive device to completely open the movable shielding device at the top opening, controls the placement table to ascend, and controls the running vehicle to place the carried mask carrier on the placement table.

11. The exposure machine according to claim 10, wherein the control unit is further in signal connection with the proximity switches; and
in the automatic mode:
when the running vehicle moves to the first position close to the top opening, and when the proximity switches are in the first state, the control unit controls the drive device to completely open the movable shielding device at the top opening, controls the placement table to ascend, and controls the running vehicle to place the carried mask carrier on the placement table.

12. The exposure machine according to claim 10, wherein the exposure machine further comprises an automatic mode indicator in signal connection with the control unit; and
in the automatic mode:
when the proximity switches are in the first state, and when the first photoelectric sensor and the third photoelectric sensor detect that the drive device has completely opened the movable shielding device at the top opening, the control unit controls the automatic mode indicator to emit light.

13. The exposure machine according to claim 10, wherein the exposure machine further comprises an alarm device in signal connection with the control unit, and the alarm device is configured to generate an alarm signal; and
in the automatic mode:
when the proximity switches are in the second state, the control unit controls the alarm device to generate the alarm signal.

14. The exposure machine according to claim 10, wherein the exposure machine has a manual mode, and in the manual mode:
the control unit controls the drive device to close the movable shielding device at the top opening, controls the proximity switches to be in the second state, and controls the placement table to descend to enable the mask carrier to be placed on the placement table through the front side opening.

15. The exposure machine according to claim 14, wherein the exposure machine further comprises a manual mode indicator in signal connection with the control unit; and
in the manual mode:
when the second photoelectric sensor and the fourth photoelectric sensor detect that the drive device has completely closed the movable shielding device at the top opening, and when the proximity switches are in the second state, the control unit controls the manual mode indicator to emit light.

* * * * *